(12) United States Patent
Okanobu

(10) Patent No.: US 6,529,100 B1
(45) Date of Patent: Mar. 4, 2003

(54) POLYPHASE FILTER AND RECEIVER USING THE SAME

(75) Inventor: Taiwa Okanobu, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/654,854

(22) Filed: Sep. 5, 2000

(30) Foreign Application Priority Data

Sep. 6, 1999 (JP) .......................................... 11-251390

(51) Int. Cl.[7] .............................................. H03H 7/075
(52) U.S. Cl. ...................................... 333/172; 333/168
(58) Field of Search .................................. 333/172, 168

(56) References Cited

U.S. PATENT DOCUMENTS 4,123,712 A * 10/1978 Mikhael ..................... 325/137
4,683,444 A * 7/1987 Kappeler ...................... 331/25
5,189,593 A * 2/1993 Ooi .............................. 455/195
5,341,107 A * 8/1994 Bijker et al. ................. 329/337
5,701,088 A * 12/1997 Fujimaki ..................... 324/765
6,035,186 A * 3/2000 Moore et al. ................ 455/313

* cited by examiner

Primary Examiner—Robert Pascal
Assistant Examiner—Joseph Chang
(74) Attorney, Agent, or Firm—Jay H. Maioli (57) ABSTRACT

A polyphase filter having metal-insulator-semiconductor (MIS) capacitors in which the whole body of the polyphase filter is fabricated as an IC. Resistors are individually combined with the capacitors to form serial connection circuits and every four signal connection circuits individually form bridge circuits that are connected in a cascade manner. When the MIS capacitors are fabricated into an IC, capacitors that are parasitic to the MIS capacitors are connected to the input sides of the resistors.

11 Claims, 8 Drawing Sheets

POLYPHASE FILTER AND RECEIVER USING THE SAME

BACKGROUND OF THE INVENTION

1. Field of the Invention

The present invention relates to a polyphase filter and a receiver using thereof.

2. Description of the Related Art

With regard to digital audio broadcasting system, DAB (Digital Audio Broadcasting complies with Eureka 147 standard) system is adopted in Europe, and ISDB-T (Integrated Services Digital Broadcasting for Terrestrial) system is proposed in Japan.

ISDB-T system employs:

- transmission band width of 432 kHz (for narrow-band ISDB-T system);
- modulation system of OFDM (Orthogonal Frequency Division Multiplex); and
- multiplexing system of MPEG2 (Moving Picture Experts Group 2); which enable simultaneous broadcasting of digital audio data and digital data in a plurality of channels. Broadcasting based on the narrow-band ISDB-T system is now planned to use the current VHF television broadcasting band.

Figure 5:
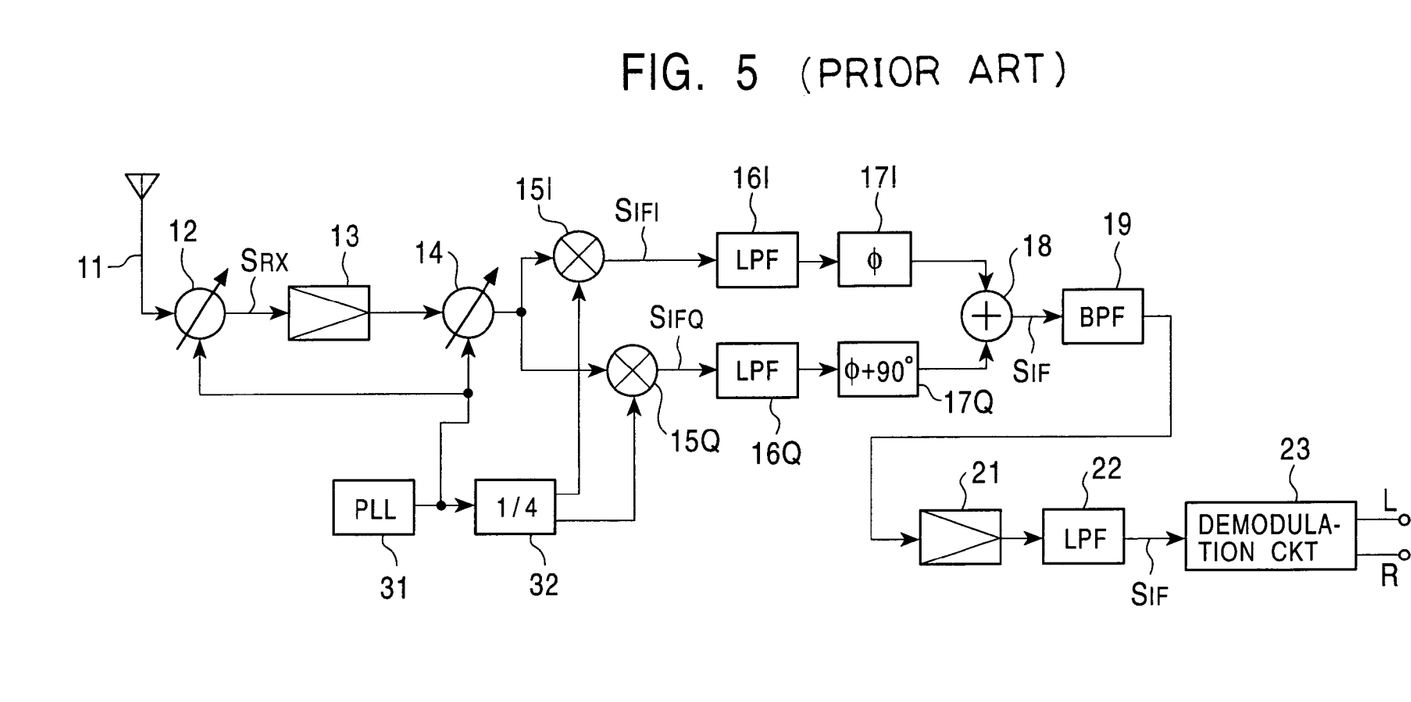
FIG. 5 is a system diagram showing an embodiment of the related art.

One example of an ISDB-T receiver is typically composed as shown in FIG. 5. The figure shows a narrow-band ISDB-T receiver employing a super heterodyne configuration.

Broadcasting wave based on the narrow-band ISDB-T system is received by an antenna 11, the received signal is then fed to an antenna tuning circuit 12 based on the electronic tuning system, thereby a received signal $S_{RX}$ having a target frequency is extracted. The extracted signal $S_{RX}$ is then fed to mixer circuits 15I, 15Q via a variable gain amplifier 13 and an inter-stage tuning circuit 14 based on the electronic tuning system.

On the other hand, an oscillation signal having a predetermined frequency is generated by a PLL (Phase Locked Loop) 31, the oscillation signal from the PLL 31 is then fed to a frequency dividing circuit 32, where the oscillation signal is divided into two signals having a frequency higher, for example, by 500 kHz than a carrier frequency (center frequency) of the received signal $S_{RX}$ and differ by 90° with each other in phase, the divided signals are then supplied to the mixer circuits 15I, 15Q as local oscillation signals.

Thus the received signal $S_{RX}$ is frequency-converted at the mixer circuits 15I, 15Q to generate two intermediate frequency signals $S_{IFI}$ and $S_{IFQ}$ (having a center frequency of 500 kHz) differ by 90° with each other in phase, that is, an in-phase intermediate frequency signal $S_{IFI}$ and a quadrature intermediate frequency signal $S_{IFQ}$ orthogonal with each other.

In this process, a part of control voltage supplied from the PLL 31 to a variable capacity diode (not shown) of its VCO (Voltage Controlled Oscillator), is extracted, and the extracted control voltage is fed to the tuning circuit 12 as a tuning voltage, which allows tuning to the received signal $S_{RX}$.

The intermediate frequency signals $S_{IFI}$ and $S_{IFQ}$ from the mixer circuits 15I, 15Q are then individually supplied to phase shifting circuits 17I, 17Q via the low pass filters 16I, 16Q, where the signals $S_{IFI}$ and $S_{IFQ}$ are phase-shifted by φ and φ+90°, respectively. The phase-shifted signals are then supplied to an adder circuit 18, from which an intermediate frequency signal $S_{IF}$ having only a desired signal component is extracted while image signal components being canceled.

The intermediate frequency signal $S_{IF}$ is then supplied on a signal line comprising a bandpass filter 19 for filtering intermediate frequency component, a variable gain amplifier 21 for AGC (Automatic Gain Control) and a low pass filter 22 to a demodulation circuit 23, where the signal is subjected to demodulation processing corresponded to the modulation processing at the time of the ISDB-T transmission, and audio signals L, R of a desired program selected from a plurality of programs (channels) are extracted from such demodulation circuit 23.

Such receiver can be integrated into an one-chip integrated circuit (IC) except the tuning circuits 12, 14, an oscillation circuit of VCO in the PLL 31 and the demodulation circuit 23.

Figure 6:
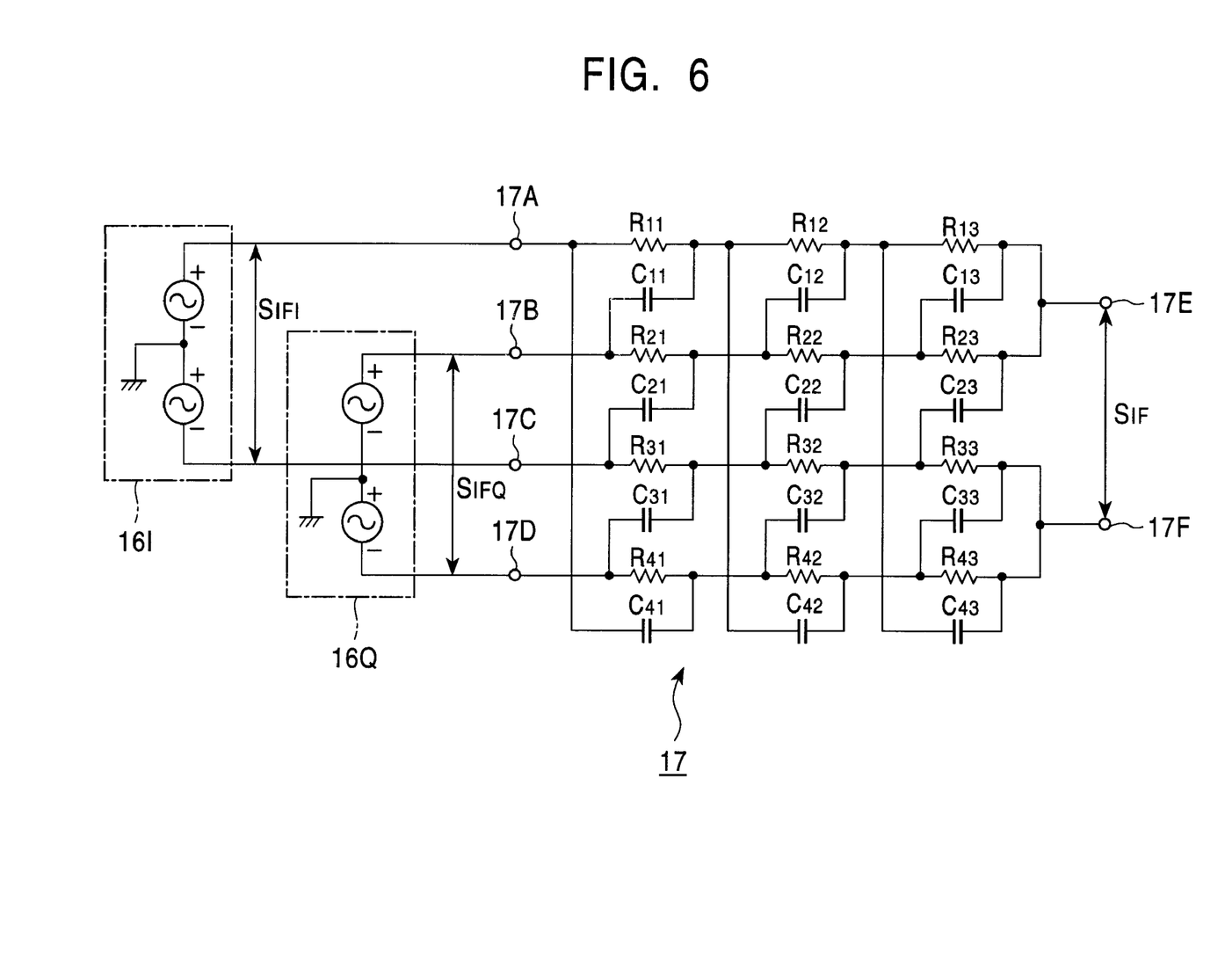
FIG. 6 is a connection diagram showing an embodiment of the polyphase filter.

The phase shifting circuits 17I, 17Q and the adder circuit 18 now can be composed by a polyphase filter 17 as shown in FIG. 6.

In this configuration, a serial connection circuit consisting of a resistor R11 and a capacitor C11 is inserted between input terminals 17A and 17B; a serial connection circuit consisting of a resistor R21 and a capacitor C21 is inserted between input terminals 17B and 17C; a serial connection circuit consisting of a resistor R31 and a capacitor C31 is inserted between input terminals 17C and 17D; and a serial connection circuit consisting of a resistor R41 and a capacitor C41 is inserted between input terminals 17D and 17A.

A serial circuit consisting of a resistor R12 and a capacitor C12 is inserted between the output side of the resistor R11 (connection point of the resistor R11 and the capacitor C11) and the output side of the resistor R21 (connection point of the resistor R21 and the capacitor C21); a serial circuit consisting of a resistor R22 and a capacitor C22 is inserted between the output sides of the resistor R21 and the output side of the resistor R31; a serial circuit consisting of a resistor R32 and a capacitor C32 is inserted between the output side of the resistor R31 and the output side of the resistor R41; and a serial circuit consisting of a resistor R42 and a capacitor C42 is inserted between the output side of the resistor R41 and the output side of the resistor R11.

Similarly, serial connection circuits individually consisting of resistors R13 to R43 and capacitors C13 to C43 are connected to the respective output sides of the resistors R12 to R42. The individual output sides of the resistors R13 and R23 are connected to an output terminal 17E, and the individual output sides of the resistors R33 and R43 are connected to an output terminal 17F.

The outputs from the low pass filters 16I and 16Q are balanced type, and the intermediate frequency signal $S_{IFI}$ output from the low pass filter 16I is supplied between the output terminals 17A and 17C, and the intermediate frequency signal $S_{IFQ}$ output from the low pass filter 16Q is supplied between the output terminals 17B and 17D. Thus an intermediate frequency signal having only a desired signal component is output in a balanced type between the output terminals 17E and 17F while image signal components being canceled.

Such polyphase filter 17 is advantageous in that it can be fabricated into an IC, and in that it is stable in the characteristic against non-uniformity in the fabrication of the IC devices and can ensure thorough elimination of the image signal component according to the foregoing method, since the resistors R11 to R43 and the capacitors C11 to C43 composing the polyphase filter 17 are in bridge connection.

In the polyphase filter 17, a frequency f17 receiving 90° phase shifting is now expressed as $$f17 = 1/(2\pi CR)$$

where, CR is a product of values for the resistors and the capacitors in the individual stages. The number of the stages of the polyphase filter 17 is determined based on the amount of attenuation required for suppressing the image signal components and specific band.

Figure 7A:
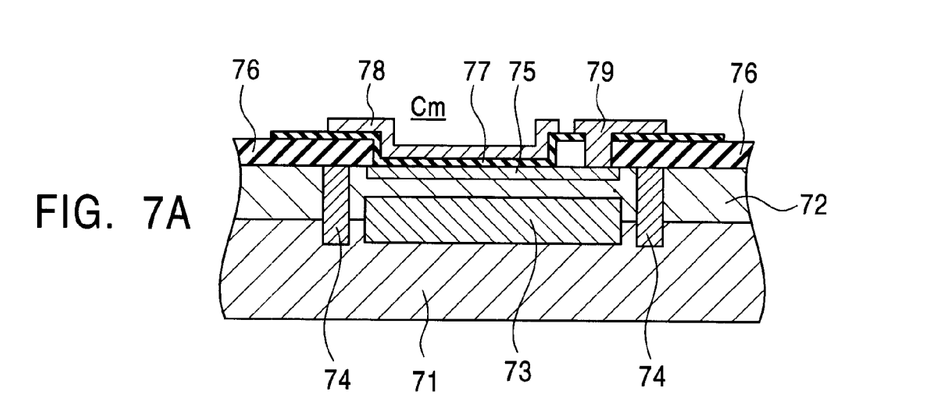
FIG. 7A is a sectional view and FIGS. 7B to 7D are connection diagrams for explaining the MIS capacitor.

When fabricating the polyphase filter 17 into an IC, the capacitors C11 to C43 can be constituted by a metal-insulator-semiconductor (MIS) capacitor as shown in FIG. 7A. In this figure, on a p-type semiconductor substrate 71, formed are an n-type epitaxial layer 72, an n$^+$-type buried region 73 and a p$^+$-type isolation region 74.

An n$^+$-type semiconductor layer 75 is formed in a superficial area of the epitaxial layer 72, and thereon an SiO$_2$ layer 76 and an extra thin insulating layer 77 are formed. Further thereon an electrode 78 is formed so as to contact the semiconductor layer 75, and an electrode 79 is formed so as to be opposed to the n$^+$-type semiconductor layer 75 while being interposed by the insulating layer 77. The electrodes 78, 79 are generally made of aluminum.

Figure 7B:
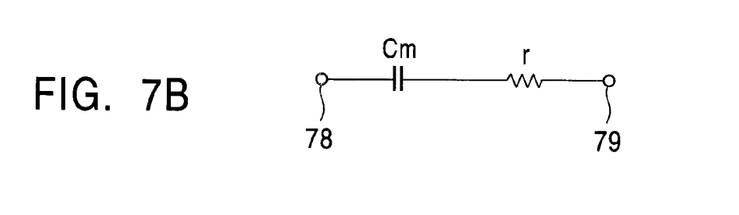

The electrode 78, the insulating layer 77 and the n$^+$-type semiconductor layer 75 are thus combined to form a capacitor Cm as shown in FIG. 7B, where the electrodes 78 and 79 serves as outlet terminals of the capacitor Cm. The symbol "r" represents resistance component of the n$^+$-type semiconductor layer 75. In the polyphase filter 17 fabricated in an IC, the capacitors C11 to C43 can individually be materialized by such MIS-type capacitor Cm.

The MIS-type capacitor Cm is advantageous in that reducing the occupied area of the capacitors C11 to C43 in the polyphase filter 17 fabricated in an IC, since the capacitor of this type has a large capacitance per unit area.

Figure 7C:
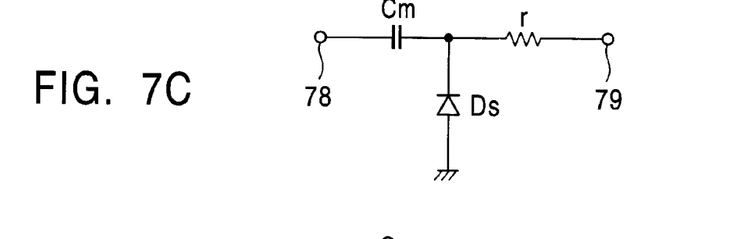

In the MIS-type capacitor Cm, however, the semiconductor layer 75 is electrically connected to the buried region 73 via the epitaxial layer 72, and the buried layer 73 and the substrate 71 together form a p-n junction. This is equivalent to that, as shown in FIG. 7C, a p-n junction Ds contributed by the buried layer 73 and the substrate 71 is connected on the electrode 79 side of the capacitor Cm.

Figure 7D:
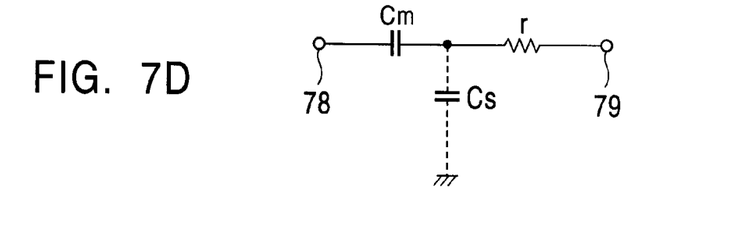

The p-n junction Ds is reversely biased when the MIS-type capacitor Cm operates, so that, as shown in FIG. 7D, the p-n junction Ds will act as a parasitic capacitor Cs. The parasitic capacitor Cs accounts for 5 to 10% of the main capacitor Cm, and the influence thereof on the polyphase filter 17 is not negligible.

Figure 8:
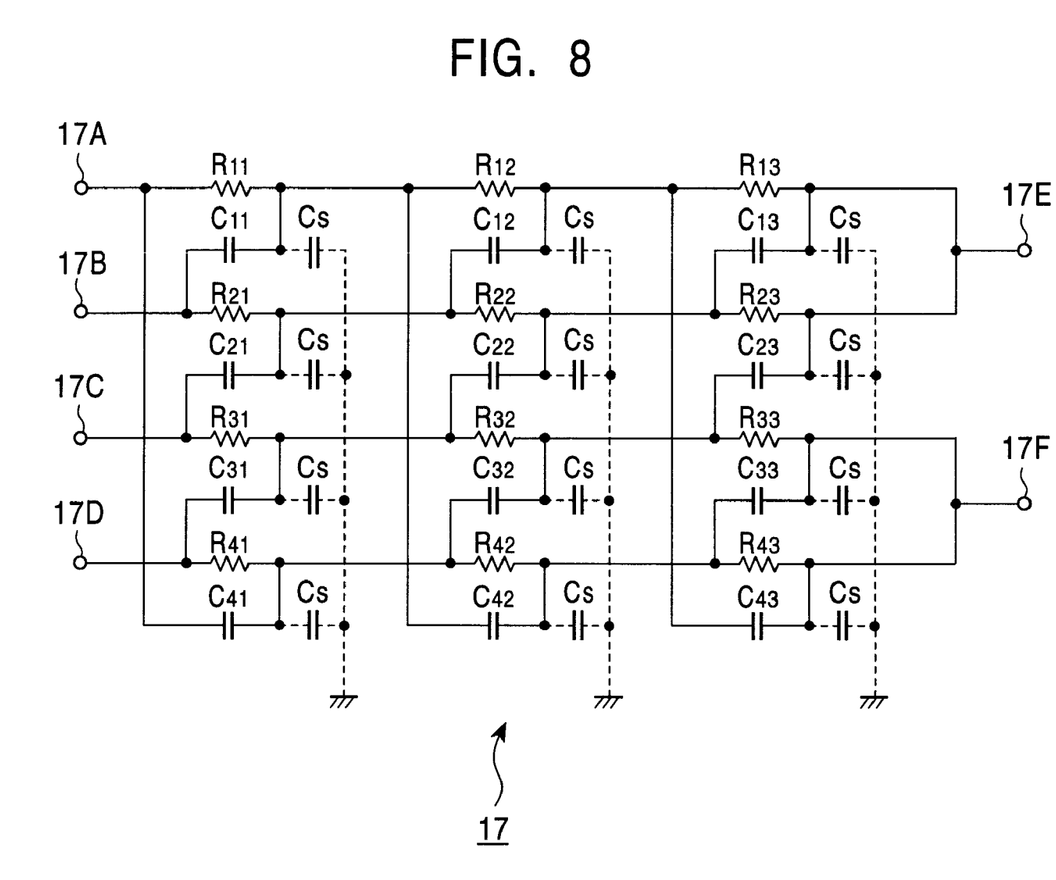
FIG. 8 is a connection diagram for explaining the related art.

FIG. 8 shows an equivalent circuit of the polyphase filter 17 in which the capacitors C11 to C43 are materialized as the MIS capacitor Cm, where the parasitic capacitor Cs also inclusive. The parasitic capacitors Cs appear on the output side of every stage. The parasitic capacitors Cs, and the resistors R11 to R43 in the previous stage thereof individually form low pass filters, which will lower the levels of the intermediate frequency signals $S_{IFI}$ and $S_{IFQ}$ passing through the polyphase filter 17.

It is thus necessary to compensate such lowering in the signal level, either by enhancing the drive ability of the output stage of the low pass filters 16I, 16Q in the former stage of the polyphase filter 17, or by raising the gain as well as reducing noise of the band pass filter 19 in the latter stage. Both methods, however, can merely compensate the signal loss in the polyphase filter 17, and cannot be an essential solution.

SUMMARY OF THE INVENTION

It is therefore an object of the present invention to solve the foregoing problem.

According to one aspect of the present invention, provided is a polyphase filter including a plurality of bridge circuits in a cascade connection, each bridge circuit being composed of four sets of serial connection circuit, and each serial connection circuit being composed of a resistor and a capacitor serially connected thereto, wherein the polyphase filter as a whole is fabricated into an integrated circuit; the capacitor is composed of a metal-insulator-semiconductor capacitor; and the metal-insulator-semiconductor capacitor is fabricated into the integrated circuit so that a parasitic capacitor accompanying said metal-insulator-semiconductor capacitor is connected to a connection point between the serial connection circuits.

According to another aspect of the present invention, provided is a polyphase filter including a plurality of bridge circuits, each bridge circuit being composed of four sets of serial connection circuit, and each serial connection circuit being composed of a resistor and a capacitor serially connected thereto, connection points between each adjacent ones of four serial connection circuits being provided as signal input terminals, connection points between the individual resistors and the individual capacitors in the individual serial connection circuits being provided as signal output terminals, a plurality of the bridge circuits being individually connected in a cascade manner via the signal input terminal and the signal output terminal, a first input signal being supplied to a first pair of the opposing signal input terminals of the bridge circuit in the first stage of a plurality of the bridge circuits in the cascade connection, a second input signal being supplied to a second pair of the opposing signal input terminals of the bridge circuit in the first stage, a first pair of the adjacent signal output terminals of the bridge circuits in the last stage of the bridge circuits in the cascade connection being connected with each other to provide a first signal output terminal, a second pair of the adjacent signal output terminals of the bridge circuits in the last stage being connected with each other to provide a second signal output terminal, so as to obtain output signals from the first and second signal output terminals; wherein the polyphase filter as a whole is fabricated into an integrated circuit; the capacitor is composed of a metal-insulator-semiconductor capacitor; and the metal-insulator-semiconductor capacitor is fabricated into the integrated circuit so that a parasitic capacitor accompanying said metal-insulator-semiconductor capacitor is connected to a connection point between the serial connection circuits composing the individual bridge circuits.

According to still another aspect of the present invention, provided is a receiver comprising:

a tuning circuit for extracting a signal to be received having a target frequency from received signals;

a first mixer circuit and a second mixer circuit to which the signal to be received extracted by the tuning circuit is supplied;

a circuit for supplying to the first and the second mixer circuits a first local oscillation signal and a second local oscillation signal being differed by 90° with each other in phase;

a polyphase filter to which a first intermediate frequency signal and a second intermediate frequency signal being differed by 90° with each other in phase output from the first and the second mixer circuits are supplied; and a demodulation circuit to which an output signal from the polyphase filter is supplied; wherein, the polyphase filter is as a whole fabricated into an integrated circuit; and includes a plurality of bridge circuits in a cascade connection, each bridge circuit being composed of four sets of serial connection circuit, and each serial connection circuit being composed of a resistor and a capacitor serially connected thereto; the capacitor being composed of a metal-insulator-semiconductor capacitor; and the metal-insulator-semiconductor capacitor being fabricated into the integrated circuit so that a parasitic capacitor accompanying said metal-insulator-semiconductor capacitor is connected to a connection point between the serial connection circuits composing the individual bridge circuits.

According to the present invention, effects of the parasitic capacitor which is likely to be produced when the capacitor of the polyphase filter is materialized by the MIS capacitor can be reduced, and thus a desired phase shifting characteristic can be obtained without correcting the transit characteristic of the polyphase filter.

It is also unnecessary to raise the gain in the former stage of the polyphase filter, nor to raise the gain and to reduce noise in the latter stage. This allows the receiver using such polyphase filter to improve its image signal characteristic.

DESCRIPTION OF THE PREFERRED EMBODIMENTS

Digital Audio Broadcasting Receiver

Figure 1:
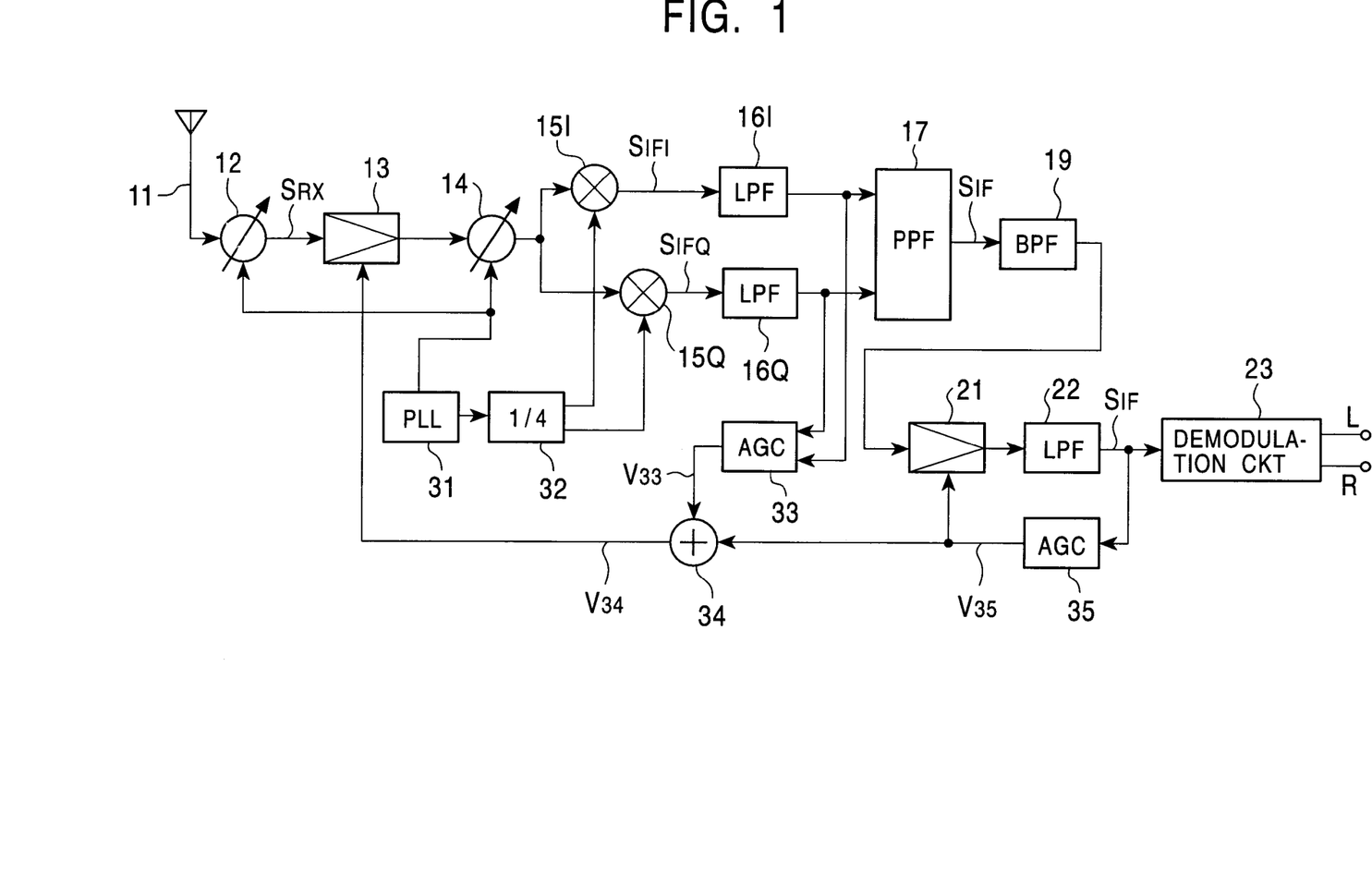
FIG. 1 is a system diagram showing an embodiment of the present invention.

A digital audio broadcasting receiver is composed, for example, as shown in FIG. 1. The figure shows a narrow-band ISDB-T receiver and is based on a super heterodyne configuration. In this figure, basically the same reference numerals are used as used in FIG. 5 for easy understanding of the present invention.

Broadcasted wave based on the narrow-band ISDB-T system is received by an antenna 11, the received signal is then fed to an antenna tuning circuit 12 based on the electronic tuning system, thereby a received signal $S_{RX}$ having a target frequency is extracted. The extracted signal $S_{RX}$ is then fed to mixer circuits 15I, 15Q via a variable gain amplifier 13 and an inter-stage tuning circuit 14 based on the electronic tuning system.

On the other hand, an oscillation signal having a predetermined frequency is generated by a PLL 31, the oscillation signal from the PLL 31 is fed to a frequency dividing circuit 32, where the oscillation signal is divided into two signals having a frequency higher, for example, by 500 kHz than a carrier frequency (center frequency) of the received signal $S_{RX}$ and differ by 90° with each other in phase, the divided signals are then supplied to the mixer circuits 15I, 15Q as local oscillation signals.

Thus the received signal $S_{RX}$ is frequency-converted in the mixer circuits 15I, 15Q to generate two intermediate frequency signals $S_{IFI}$ and $S_{IFQ}$ (with a center frequency of 500 kHz) differ with each other in phase by 90°, that is, an in-phase intermediate frequency signal $S_{IFI}$ and a quadrature intermediate frequency signal $S_{IFQ}$ orthogonal with each other.

In this process, a part of control voltage supplied from the PLL 31 to a variable capacity diode (not shown) of its VCO (Voltage Controlled Oscillator), is extracted, and the extracted control voltage is fed to the tuning circuit 12 as a tuning voltage, which allows tuning to the received signal $S_{RX}$.

The intermediate frequency signals $S_{IFI}$ and $S_{IFQ}$ from the mixer circuits 15I, 15Q are then supplied to a polyphase filter 17 having a constitution described later, and therefrom an intermediate frequency signal $S_{IF}$ having only a desired signal component is extracted while image signal components being canceled.

The intermediate frequency signal $S_{IF}$ is then supplied on a signal line comprising a band pass filter 19 for filtering intermediate frequency component, a variable gain amplifier 21 for AGC (Automatic Gain Control) and a low pass filter 22 to a demodulation circuit 23. The demodulation circuit 23 is responsible for various demodulation processes corresponding the modulation processing at the time of the ISDB-T transmission, which include complex Fourier transformation, frequency de-interleaving, time de-interleaving, selection of digital audio data for a target channel from two or more channels, error correction and data expansion.

Audio signals L, R of a desired program selected from a plurality of programs (channels) are extracted from such demodulation circuit 23.

On the other hand, the intermediate frequency signal $S_{IF}$ from the low pass filter 22 is supplied to an AGC detection circuit 35 to generate an AGC voltage V35, which is supplied to the variable gain amplifier 21 as a gain control signal.

The intermediate frequency signals $S_{IFI}$, $S_{IFQ}$ from the low pass filters 16I, 16Q are supplied to the AGC detection circuit 33 to generate a delayed AGC voltage V33, which is supplied to an adder circuit 34. Also the AGC voltage V35 is supplied to the adder circuit 34. From the adder circuit 34 obtained is an summed voltage V34 of the delayed AGC voltage V33 and the AGC voltage V35, and the summed voltage V34 is then supplied to the variable gain amplifier 13 as a gain control signal.

Thus automatic gain control is effected using the AGC voltage V34 on the received signal $S_{RX}$ from the tuning circuit 12, and is also effected using the AGC voltage V35 on the intermediate frequency signal $S_{IF}$ from the band pass filter 19.

Such receiver can be integrated into an one-chip IC except the tuning circuits 12, 14, an oscillation circuit of VCO in the PLL 31 and the demodulation circuit 23.

The Polyphase Filter 17

It is generally known that loss in the polyphase filter can be suppressed by setting the impedance so as to increase from the bridge circuit in the input stage toward the bridge circuit in the output stage. Thus the value of the resistors in the bridge circuits are generally selected so as to increase towards the latter stage.

From this aspect, the present invention is to relieve the polyphase filter 17 from characteristic degradation due to parasitic capacitor Cs when the capacitors in the polyphase filter 17 are configured as MIS capacitors.

Figure 2:
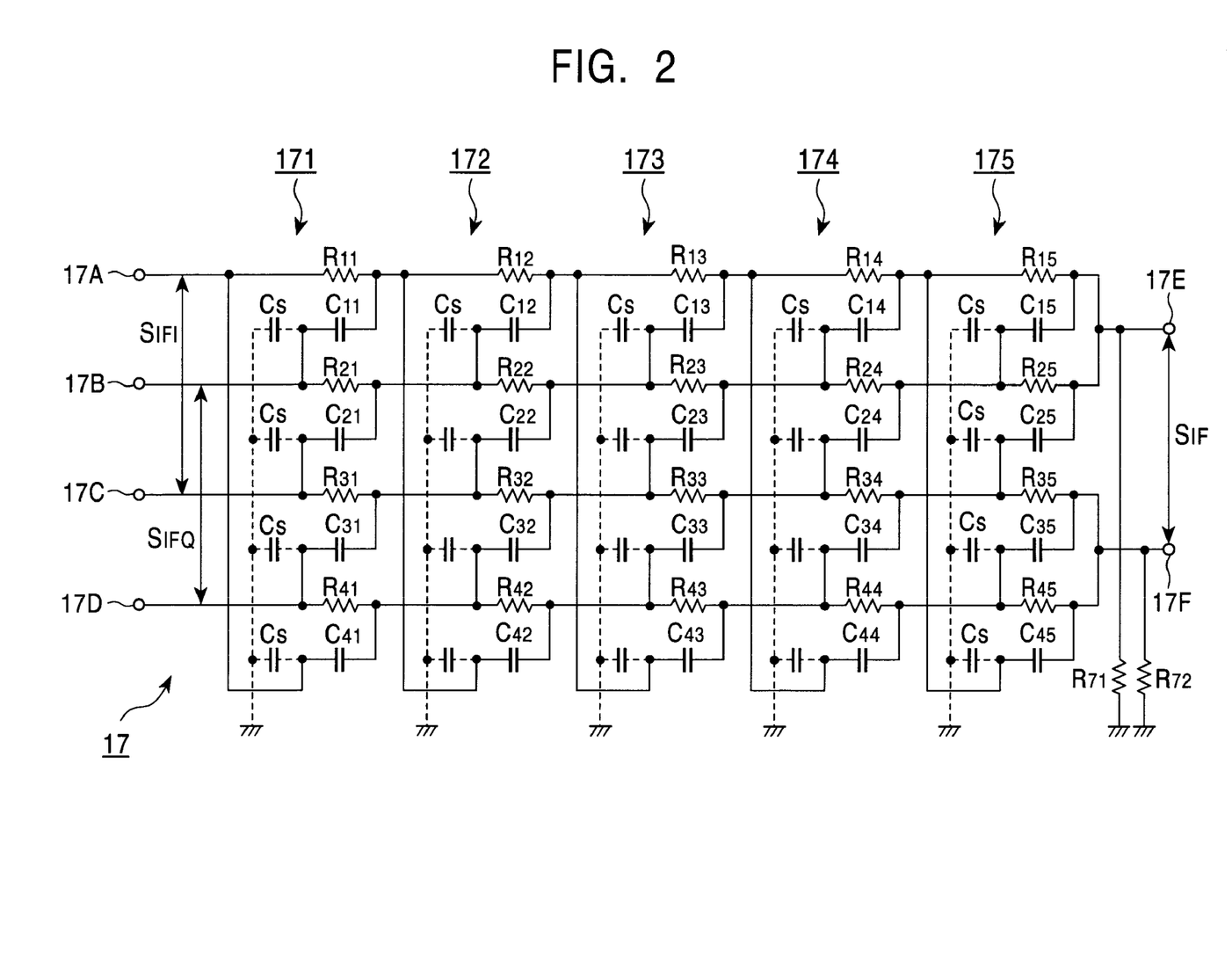
FIG. 2 is a connection diagram showing an embodiment of the present invention.

Thus the polyphase filter 17 is constituted, for example, as shown in FIG. 2. The figure shows an exemplary case of the five-stage polyphase filter 17 having five bridge circuits 171 to 175.

In this configuration, a serial connection circuit consisting of a resistor R11 and a capacitor C11 is inserted between input terminals 17A and 17B; a serial connection circuit consisting of a resistor R21 and a capacitor C21 is inserted between input terminals 17B and 17C; a serial connection circuit consisting of a resistor R31 and a capacitor C31 is inserted between input terminals 17C and 17D; and a serial connection circuit consisting of a resistor R41 and a capacitor C41 is inserted between input terminals 17D and 17A. A bridge circuit 171 in the first stage of the polyphase filter 17 is thus configured.

A serial circuit consisting of a resistor R12 and a capacitor C12 is inserted between the output side of the resistor R11 and the output side of the resistor R21; a serial circuit consisting of a resistor R22 and a capacitor C22 is inserted between the output sides of the resistor R21 and the output side of the resistor R31; a serial circuit consisting of a resistor R32 and a capacitor C32 is inserted between the output side of the resistor R31 and the output side of the resistor R41; and a serial circuit consisting of a resistor R42 and a capacitor C42 is inserted between the output side of the resistor R41 and the output side of the resistor R11. A bridge circuit 172 in the second stage of the polyphase filter 17 is thus configured.

Similarly, resistors R13 to R43 and capacitors C13 to C43 are connected to the bridge circuit 172 to provide a bridge circuit 173 of the third stage of the polyphase filter 17; and also similarly, the resistors R14 and R 44 are connected to an output terminal 17E, and resistors R14 to R44 and capacitors C14 to C44 are connected to the bridge circuit 173 to provide a bridge circuit 174 of the fourth stage. Moreover, resistors R15 to R45 and capacitors C15 to C45 are similarly connected to the bridge circuit 174 to provide a bridge circuit 175 of the fifth stage.

The individual output sides of the resistors R15 and R25 are connected to an output terminal 17E, and the individual output sides of the resistors R35 and R 45 are connected to an output terminal 17F. Load resistors R71, R72 are respectively connected between the output terminals 17E, 17F and the ground.

The polyphase filter 17 intended for use in the receiver previously shown in FIG. 1 can be integrated into an IC together with the circuits of the receiver, where individual capacitors C11 to C45 are configured, for example, by the MIS capacitor Cm shown in FIG. 7.

Figure 3:
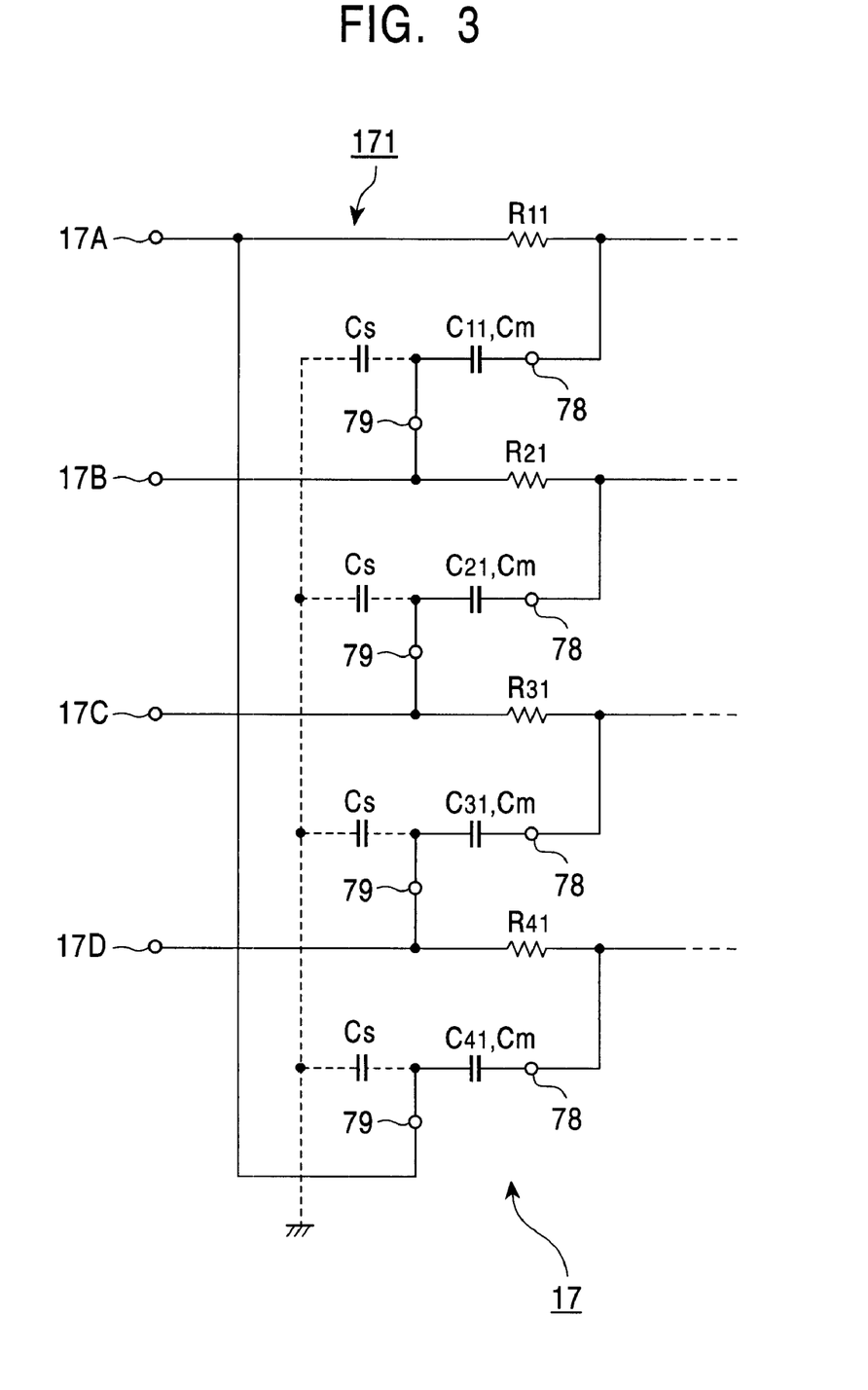
FIG. 3 is a connection diagram showing an embodiment of the present invention.

When the polyphase filter 17 is intended to be integrated into an IC, the MIS capacitor Cm is fabricated into the IC so that, as shown in FIG. 3 representatively illustrating the bridge circuit 171, terminals (electrodes) 78, 78 of the capacitors C11 to C41 (capacitance Cm, Cm) are connected to the output side of the resistors R11 to R41, and so that the terminals (electrodes) 79, 79 are connected to the input side of the resistors R21 to R41 and R11. The bridge circuits 172 to 175 are also integrated into the IC in a similar manner.

To suppress loss in the polyphase filter 17, the values for the resistors R11 to R45 in the bridge circuits 171 to 175 are generally selected so as to increase toward the latter stage.

The number of the stages of the polyphase filter 17 is determined based on the amount of attenuation required for suppressing the image signal components and specific band. In the polyphase filter 17, a frequency f17 receiving 90° phase shifting is now expressed as $$f17=1/(2\pi CR)$$

where, CR is a product of values for the resistors and the capacitors in the individual stages. Preferable setting relates to:

R11=R21=R31=R41;
R12=R22=R32=R42;
R13=R23=R33=R43;
R14=R24=R34=R44;
R15=R25=R35=R45; and
R11:R12:R13:R14:R15=1:2:4:4:8
Preferable setting also relates to:
R71=R72; and
R11:R71=1:10

It is preferable that the values for the load resistors R71, R72 are larger than those for the resistors R15, R25, R35, R45 and R55 of the bridge circuit in the last stage so as to suppress loss in such loads resistors.

The outputs from the low pass filters 16I and 16Q are balanced type, and the intermediate frequency signal $S_{IFI}$ output from the low pass filter 16I is supplied between the output terminals 17A and 17C, and the intermediate frequency signal $S_{IFQ}$ output from the low pass filter 16Q is supplied between the output terminals 17B and 17D. Thus an intermediate frequency signal having only a desired signal component is output in a balanced type between the output terminals 17E and 17F while image signal components being canceled.

It is now apparent from comparison between the polyphase filters 17 shown in FIG. 2 and FIG. 8, assuming that the both having an equal number of stages of the bridge circuits, that the polyphase filter 17 shown in FIG. 2 will have the low pass filters contributed by the parasitic capacitor Cs and the resistors in the former stage thereof but will have no low pass filters in the bridge circuit 175 in the last stage, so that the total number of the stages of the low pass filters will be subtracted by one.

The polyphase filter 17 shown in FIG. 2 is also advantageous in that effects of the parasitic capacitors Cs, Cs of the bridge circuit 171 in the first stage can be reduced by lowering the output impedance of the low pass filters 16I, 16Q provided in the former stage thereof.

The polyphase filter 17 shown in FIG. 2 is still also advantageous in that no low pass filters are produced on the output sides of the resistors R15 to R45 of the bridge circuit 175 in the last stage having a largest impedance since no parasitic capacitors Cs, Cs are connected thereto.

From three these viewpoints, the polyphase filter 17 shown in FIG. 2 can be improved in its frequency characteristic, and can limit the signal attenuation even if the MIS capacitor Cm is accompanied by the parasitic capacitor Cs.

Figure 4:
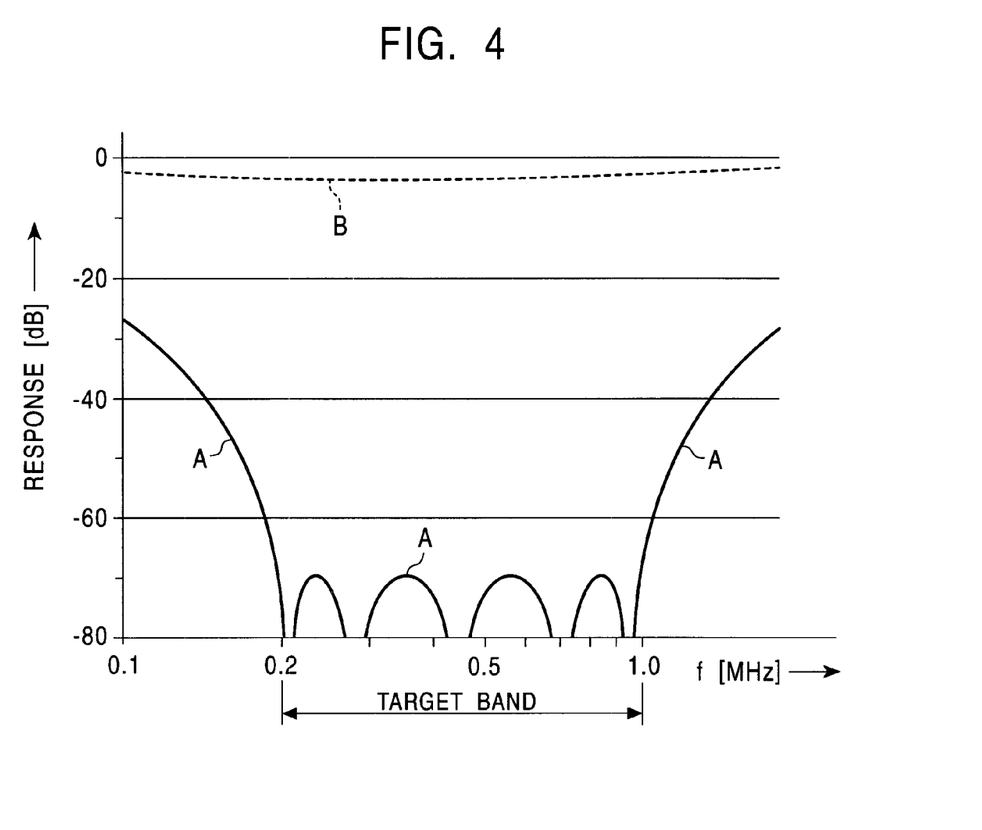
FIG. 4 is a characteristic diagram for explaining the present invention.

In FIG. 4, solid line "A" indicates an output level of the polyphase filter 17 shown in FIG. 2 supplied with an image signal, assuming an output level of the desired wave signal as a reference level (=0 dB). A target band extends from 200 kHz to 1 MHz. It is found from the characteristic curve "A" that the image signal is successfully reduced as much as 69 dB or more within the target band.

Broken line "B" in FIG. 4 indicates an output level of the desired wave signal of the polyphase filter 17 shown in FIG. 8 configured in five stages, also assuming an output level of the desired wave signal of the polyphase filter 17 shown in FIG. 2 as a reference level (=0 dB).

It is found from the characteristic curve "B" that the polyphase filter 17 shown in FIG. 8 with a five-stage configuration can only afford an output level of the desired wave signal lower by 4 dB as compared with that for the polyphase filter 17 shown in FIG. 2. In other words, the polyphase filter 17 shown in FIG. 2 is improved in the output level of the desired wave signal by 4 dB at maximum as compared with that for the polyphase filter 17 shown in FIG. 8 with a five-stage configuration.

According to the polyphase filter 17 shown in FIG. 2, even if the capacitors C11 to C45 thereof are composed by the MIS capacitor Cm, effects of the capacitor Cs parasitic to the MIS capacitor Cm can be reduced, and thus the frequency characteristic of the polyphase filter 17 is prevented from being excessively lowered, which results in leveling of the overall transit characteristic. Connecting the load resistors R71, R72 to the output terminals 17E, 17F also contributes further leveling of the transit characteristic. Thus a desired phase shifting characteristic can be obtained without correcting the transit characteristic of the polyphase filter 17, and the image signal component can be removed, for example, by virtue of the characteristic curve "A" in FIG. 4.

Relieving effects of the parasitic capacitor Cs also result in reduction in loss causative of such parasitic capacitor Cs. This eliminates necessity in enhancing the drive ability of the output stages of the low pass filters 16I, 16Q provided in the former stage of the polyphase filter 17, reduces the power consumption thereof, and reduces the size of the transistors. It is also unnecessary to enhance the gain of the band pass filter 19 in the latter stage nor to reduce the noise thereof.

What is claimed is:

1. A polyphase filter comprising:
   a plurality of bridge circuits in a cascade connection, each said bridge circuit being composed of four serial connection circuits, and each serial connection circuit being composed of a resistor and a capacitor serially connected, wherein
   the polyphase filter as a whole is fabricated into an integrated circuit;
   each said capacitor is composed of a metal-insulator-semiconductor capacitor; and
   each said metal-insulator-semiconductor capacitor is fabricated into the integrated circuit so that a parasitic capacitor formed by a p-n junction between the metal-insulator-semiconductor capacitor and a semiconductor substrate of the metal-insulator-semiconductor capacitor and accompanying said metal-insulator-semiconductor capacitor is connected between an input side of the resistor of a succeeding serial connection circuit and ground.

2. A polyphase filter comprising:
   a plurality of bridge circuits, each said bridge circuit being composed of four serial connection circuits, and each said serial connection circuit being composed of a resistor and a capacitor serially connected,
   connection points between adjacent ones of the four serial connection circuits being provided as signal input terminals,
   connection points between the resistors and the capacitors in the four serial connection circuits being provided as signal output terminals,
   so that the plurality of the bridge circuits are connected in cascade via the signal input terminals and the signal output terminals,
   a first input signal being supplied to a first pair of opposing signal input terminals of the bridge circuit in a first stage of the plurality of the bridge circuit connected in cascade,
   a second input signal being supplied to a second pair of opposing signal input terminals of the bridge circuit in the first stage,
   a first pair of adjacent signal output terminals of the bridge circuits in a last stage of the plurality of bridge circuits connected in cascade being connected with each other to provide a first signal output terminal,
   a second pair of adjacent signal output terminals of the bridge circuit in the last stage being connected with each other to provide a second signal output terminal, so as to obtain output signal from the first and second signal output terminals; wherein
   the polyphase filter as a whole is fabricated into an integrated circuit;
   the capacitor is composed of a metal-insulator-semiconductor capacitor; and
   the metal-insulator-semiconductor capacitor is fabricated into the integrated circuit so that a parasitic capacitor formed by a p-n junction between the metal-insulator-semiconductor capacitor and a semiconductor substrate of the metal-insulator-semiconductor capacitor and accompanying said metal-insulator-semiconductor capacitor is connected between an input side of the resistor of a succeeding serial connection circuit and ground.

3. The polyphase filter as claimed in claim 2, wherein load resistors are individually connected to the first and the second signal output terminals.

4. The polyphase filter as claimed in claim 2, wherein a resistance value of the individual resistors composing the plurality of bridge circuits connected in cascade increases from the bridge circuit in the first stage toward the bridge circuit in the last stage.

5. The polyphase filter as claimed in claim 4, further comprising load resistors respectively connected to the first and the second signal output terminals.

6. The polyphase filter as claimed in claim 2, wherein the metal-insulator-semiconductor capacitor comprises:
   a semiconductor layer formed on a semiconductor substrate;
   an insulating layer formed on the semiconductor layer; and
   an electrode formed on the insulating layer;
   said electrode being connected to a connection point between the capacitor including such electrode and the resistor composing together with said capacitor the serial connection circuit at an output side of said resistor.

7. The polyphase filter as claimed in claim 6, wherein the resistor is materialized by resistance of the semiconductor layer.

8. The polyphase filter as claimed in claim 6, further comprising load resistors respectively connected to the first and the second signal output terminals.

9. The polyphase filter as claimed in claim 2, further comprising load resistors respectively connected to the first and the second signal output terminals.

10. A receiver comprising:
    a tuning circuit for extracting a desired signal having a target frequency from received signals;
    a first mixer circuit and a second mixer circuit to which the desired signal extracted by the tuning circuit is supplied;
    a circuit for supplying to the first and the second mixer circuits a first local oscillation signal and a second local oscillation signal being different in phase by 90° from each other;
    a polyphase filter to which a first intermediate frequency signal and a second intermediate frequency signal being different in phase by 90° from each other output from the first and the second mixer circuits are supplied; and a demodulation circuit to which an output signal from the polyphase filter is supplied; wherein, the polyphase filter is as a whole fabricated into an integrated circuit; and includes a plurality of bridge circuits in a cascade connection, each said bridge circuit being composed of four serial connection circuits, and each said serial connection circuit being composed of a resistor and a capacitor serially connected;

the capacitor being composed of a metal-insulator-semiconductor capacitor; and the metal-insulator-semiconductor capacitor being fabricated into the integrated circuit so that a parasitic capacitor formed by a p-n junction between the metal-insulator-semiconductor capacitor and a semiconductor substrate of the metal-insulator-semiconductor capacitor and accompanying said metal-insulator-semiconductor capacitor is connected between an input of the resistor of a succeeding serial connection circuit and ground.

11. A receiver as claimed in claim 10 further comprising:

a first low pass filter and a second low pass filter;

said first and second low pass filters being respectively supplied with signals from the first and the second mixer circuits for extracting therefrom the first intermediate frequency signal and the second intermediate frequency signal that differ in phase by 90° from each other, and for supplying the first and the second intermediate frequency signals to the polyphase filter; and said first and second low pass filters having an output impedance smaller than an impedance ascribable to the parasitic capacitor accompanying the metal-insulated-semiconductor capacitor of the bridge circuit in the first stage of a plurality of the bridge circuits in the cascade connection.

* * * * *